(12) United States Patent
Szczypinski

(10) Patent No.: US 8,098,086 B2
(45) Date of Patent: Jan. 17, 2012

(54) INTEGRATED CIRCUIT AND PROGRAMMABLE DELAY

(75) Inventor: Kazimierz Szczypinski, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/939,468

(22) Filed: Nov. 4, 2010

(65) Prior Publication Data

US 2011/0057699 A1    Mar. 10, 2011

Related U.S. Application Data

(62) Division of application No. 12/195,120, filed on Aug. 20, 2008, now Pat. No. 7,928,790.

(51) Int. Cl.
  *H03L 7/00* (2006.01)
(52) U.S. Cl. ........................ 327/161; 327/261
(58) Field of Classification Search ................ None
  See application file for complete search history.

(56) References Cited

U.S. PATENT DOCUMENTS

| | | | |
|---|---|---|---|
| 6,774,693 B2 | 8/2004 | Carr | |
| 6,930,525 B2 | 8/2005 | Lin et al. | |
| 6,944,039 B1 * | 9/2005 | Nataraj et al. | 365/49.17 |
| 7,274,237 B2 | 9/2007 | Zimlich | |
| 7,276,951 B2 | 10/2007 | Kwak | |
| 7,411,437 B2 * | 8/2008 | Vook et al. | 327/291 |
| 7,489,587 B2 | 2/2009 | Bell et al. | |
| 2007/0133671 A1 | 6/2007 | Tsai | |
| 2007/0247206 A1 * | 10/2007 | Vook et al. | 327/261 |
| 2007/0273416 A1 | 11/2007 | Heyne | |
| 2008/0054945 A1 | 3/2008 | El-Kik | |

* cited by examiner

*Primary Examiner* — Cassandra Cox

(74) *Attorney, Agent, or Firm* — Dicke, Billig & Czaja, PLLC

(57) ABSTRACT

Integrated circuit and programmable delay. One embodiment provides an integrated circuit including a programmable delay element having a plurality of single delay cells. The delay cells include a first input and a second input and a first output. The delay cells are arranged to form a chain such that the first output of a preceding delay cell is coupled to the second input of a successive delay cell. The first inputs of any delay cells are configured to receive an input signal to be delayed. The delay cells out of the plurality of delay cells is configured to constitute a starting point of a signal path including any of the delay cells arranged downstream of the starting point. The first output of the last delay cell in the chain forms an output of the programmable delay element.

21 Claims, 9 Drawing Sheets

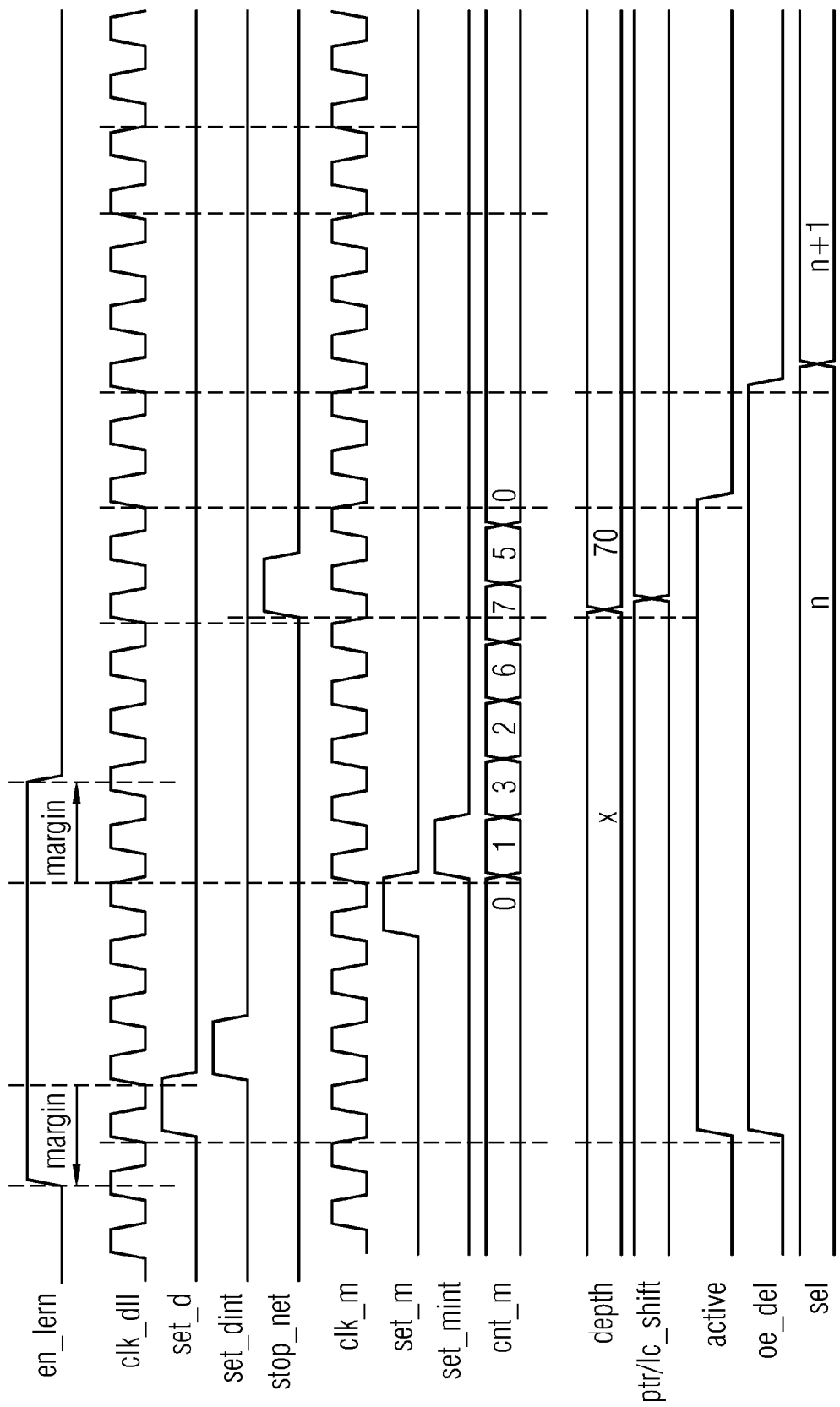

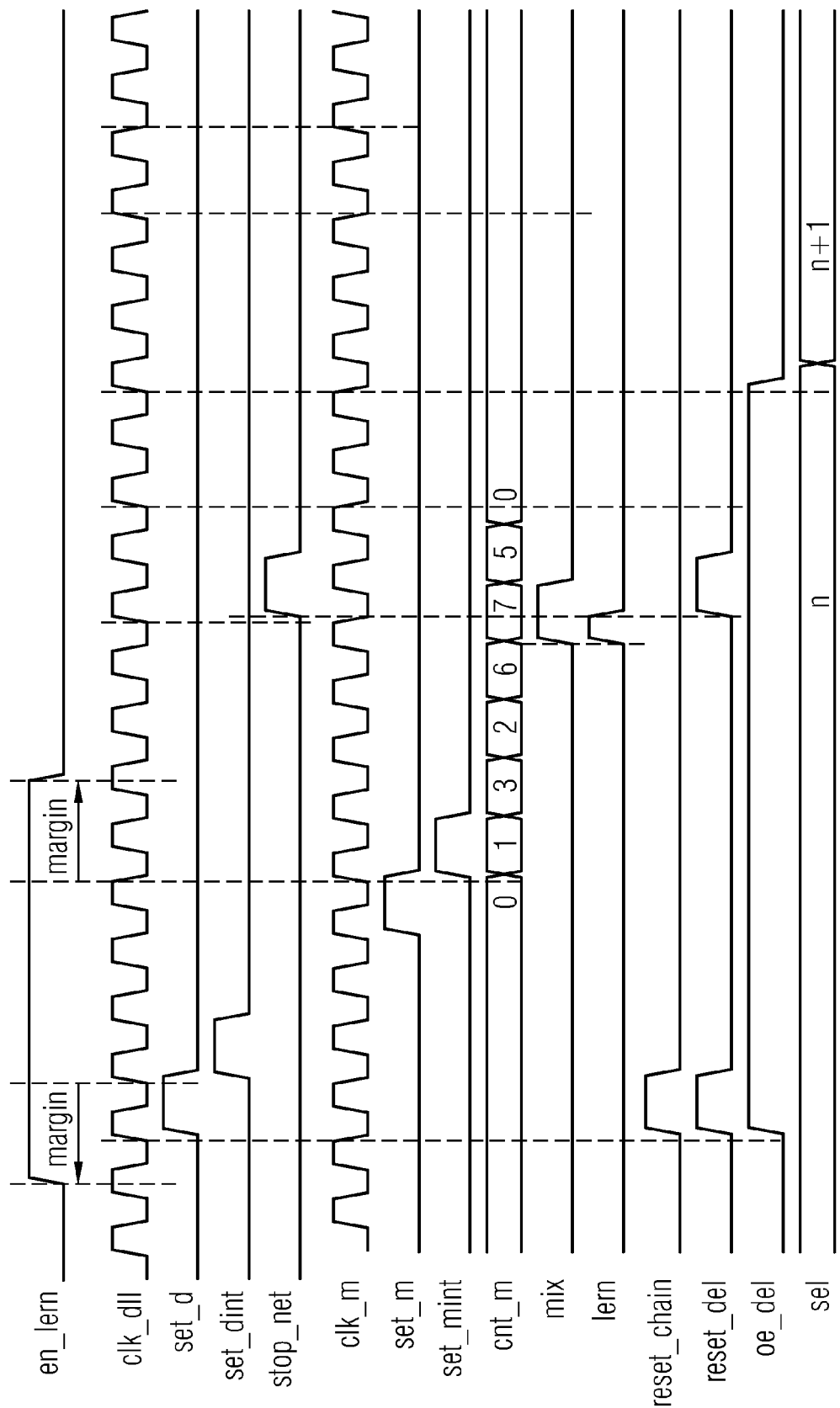

US 8,098,086 B2

INTEGRATED CIRCUIT AND PROGRAMMABLE DELAY

CROSS-REFERENCE TO RELATED APPLICATIONS

This Utility Patent Application is a divisional application of U.S. application Ser. No. 12/195,120, filed Aug. 20, 2008, which is incorporated herein by reference.

BACKGROUND

The invention relates to integrated circuits, such as electronic memory devices, microprocessors, signal processors and integrated logic devices.

Although a DRAM requires continuous refreshing of stored information, speed and information density, combined with a relatively low cost, have put the DRAM to a pivotal position in the field of information technology. Almost every type of computer system takes advantage of this economic and fast data storage technology. In order to store a plurality of data, it is known to those skilled in the art to arrange a plurality of memory cells in a matrix. Every single memory cell out of the matrix may be addressed by using a column address and a row address. It is possible to write and read data to specific addresses in the matrix.

Read and write commands as well as data transport is synchronized by using a clock signal. The clock signal may be generated on the same semiconductor die including the memory cells. As an alternative, the clock signal may be generated by a separate device such as a memory controller, which is coupled with the DRAM and which may be part of a computer system including the DRAM.

Command and data signals traveling on the semiconductor die are subject to unavoidable delays. Therefore, output signals which are generated by the integrated circuit from respective input signals may be out of phase, i.e. not synchronized to the external clock signal.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 8 illustrates a timing diagram of signals which may be involved when operating a circuit according to FIG. 6.

FIG. 9 illustrates another timing diagram illustrating signals which may be involved when operating the circuit according to FIG. 6.

DETAILED DESCRIPTION

Figure 1:
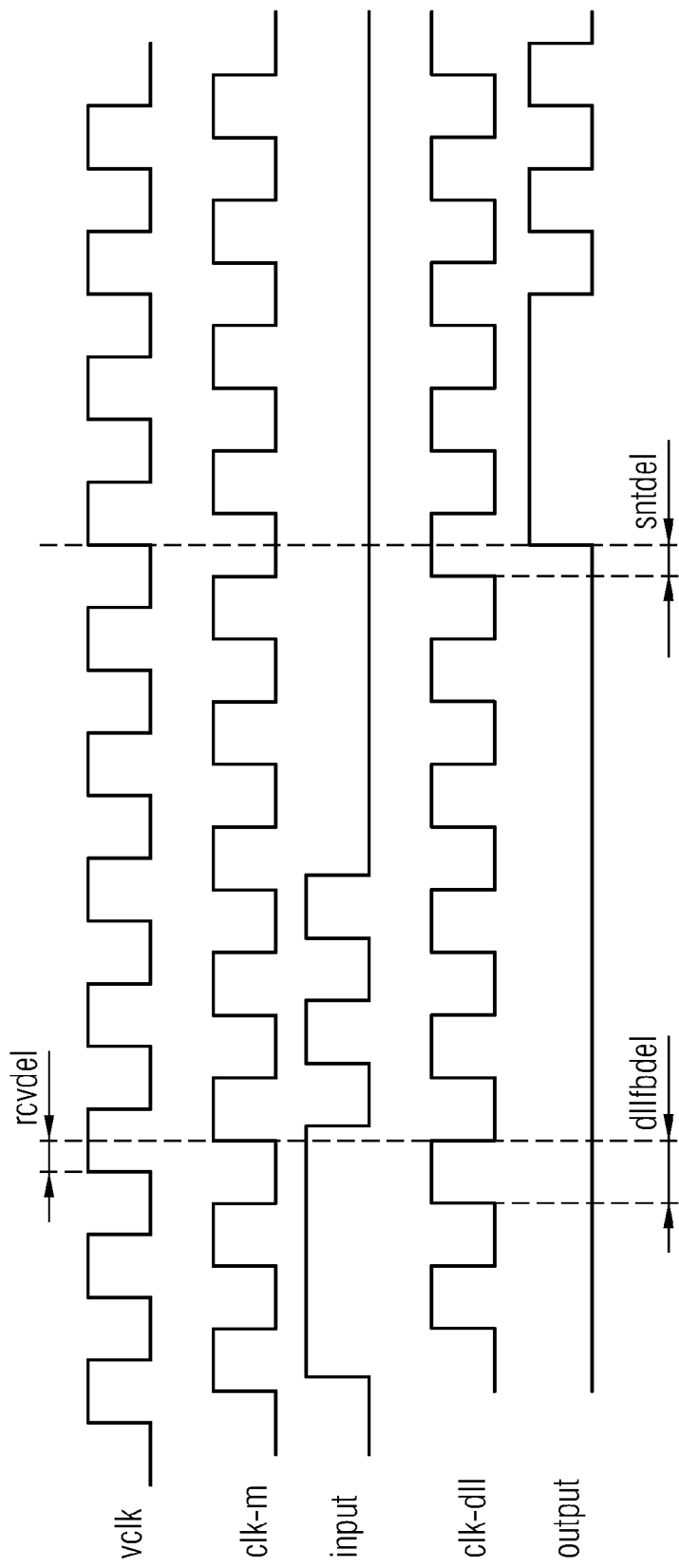
FIG. 1 illustrates a timing diagram of some signals involved according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Also, signal names used below are exemplary names, indicative of signals used to perform various functions in a given memory device. In some cases, the relative signals may vary from device to device. Furthermore, the circuits and devices described below and depicted in the Figures are merely exemplary of embodiments. As recognized by those of ordinary skill in the art, embodiments may be utilized with any device such as a memory device; a microprocessor, a microcontroller, a digital signal processor or the like.

If an embodiment is used with a memory device, it may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module.

The memory module may include other devices including memories, a buffer chip device, and/or a controller chip device. The memory module may also be included in a larger system such as the systems described above.

One embodiment resynchronizes an output signal of an integrated circuit to a given clock signal.

Another embodiment provides a programmable delay which is capable of applying a predetermined delay to a signal.

One or more embodiments relate to a programmable delay element having a plurality of single delay cells, wherein any of the delay cells includes a first input and a second input and a first output, wherein the delay cells are arranged to form a chain such that the first output of a preceding delay cell is coupled to the second input of a successive delay cell, wherein the first inputs of any delay cells are configured to receive an input signal to be delayed, wherein one of the delay cells out of the plurality of delay cells is configured to constitute a starting point of a signal path including any of the delay cells arranged downstream of the starting point, and wherein the first output of the last delay cell in the chain forms an output of the programmable delay element.

Another embodiment relates to an integrated circuit including at least two inputs and at least one output, the integrated circuit being configured to receive an input signal at its first input and a clock signal at its second input, wherein the integrated circuit is configured to generate an output signal from the input signal, and wherein a shift register is provided which is configured to delay the output signal for a predetermined number of clock cycles of the clock signal and an asynchronous delay element is provided which is configured to delay the output signal for a predetermined fraction of a clock cycle of the clock signal.

Still another embodiment relates to a method for providing an output signal generated from an input signal, the input signal being synchronized to a first clock signal and the output signal being delayed such that the output signal is also synchronized to the first clock signal, including the process of determination of a synchronous delay, determination of an asynchronous delay, delaying the output signal by the synchronous delay, and delaying the output signal by the asynchronous delay.

FIG. 1 illustrates signals which may be involved when operating a circuit according to embodiments. The circuit is configured to receive an input signal input as illustrated in line 3 of FIG. 1. The integrated circuit derives an output signal output from the input signal received. For illustrative purposes, FIG. 1 illustrates an output signal which is identical to the input signal. In other embodiments, the output signal may be calculated from one or more input signals. As an example, the output signal might be the result of an arithmetic calculation or a logic operation. In other embodiments, the output signal may represent data stored on a storage device and the input signal may be the respective read command. In such an embodiment, the storage device may include a DRAM, a SRAM, an EPROM, an EEPROM, a flash-memory or the like. As can be seen from FIG. 1, output signal is delayed with respect to the input signal. This delay is due to the time needed for signal propagation on the circuit and the time needed for the retrieval of the output signal.

The circuit and/or the input signal may be synchronized to an external clock signal VCLK. Due to delays which occur during signal propagation on an integrated circuit, the external clock signal VCLK and the received clock signal CLK_m on a chip may illustrate a receiver delay RCVDEL. Due to delays which occur during signal propagation on an integrated circuit, the received input signal provided on the integrated circuit may have a delay with respect to the received clock signal CLK_m.

Due to the time needed for the retrieval of the output signal on the integrated circuit, the output signal has a delay of approximately seven clock cycles compared to the input signal as detailed in line 5 of FIG. 1. In one embodiment, the delay may be caused by a column address latency. In another embodiment, the delay may be caused by a raw address latency. In still another embodiment, the delay may be caused by signal propagation. In still another embodiment, the delay may be caused by logical at least one operation. It has to be noted that the delay of seven clock cycles as illustrated in FIG. 1 has been chosen for illustrative purposes only. In other embodiments, the delay may range from less than one clock cycle up to some hundreds of clock cycles.

Usually, the output signal has to be delivered from the integrated circuit to external circuitry synchronous to the external clock signal VCLK. A synchronized signal according to the understanding of this description means a signal which illustrates a leading edge substantially at the same time as a leading or a trailing edge of another signal, especially a clock signal. Two edges of two signals appear substantially at the same time, if the difference in time is smaller than predefined timing margins. A timing margin may be chosen to be less than 25% or less than 20% or less than 10% or less than 5% of the duration of a full clock cycle of a clock signal.

In order to synchronize the output signal to the external clock signal VCLK, the output signal is synchronized to a third clock signal CLK_DLL. The third clock signal CLK_DLL is generated from the received clock signal CLK_m by using a circuit which may be part of the integrated circuit. The third clock signal CLK_DLL is delayed compared to the received clock signal CLK_m by an amount DLLFBDEL, so that the output signal becomes synchronous to the external clock signal VCLK. In case that the sending circuit has a delay SNTDEL, the clock signal CLK_DLL may feature a phase shift compared to the external clock signal VCLK.

With respect to FIGS. 2-9, circuits are explained which may be used to determine and adjust the value of the phase shift DLLFBDEL between the third clock signal CLK_DLL and the external clock signal VCLK and/or between the third clock signal CLK_DLL and the second clock signal CLK_m according to embodiments. Furthermore, the circuits presented may be used to determine the number of full or half clock cycles by which the output signal should be delayed compared to the input signal.

Figure 2:
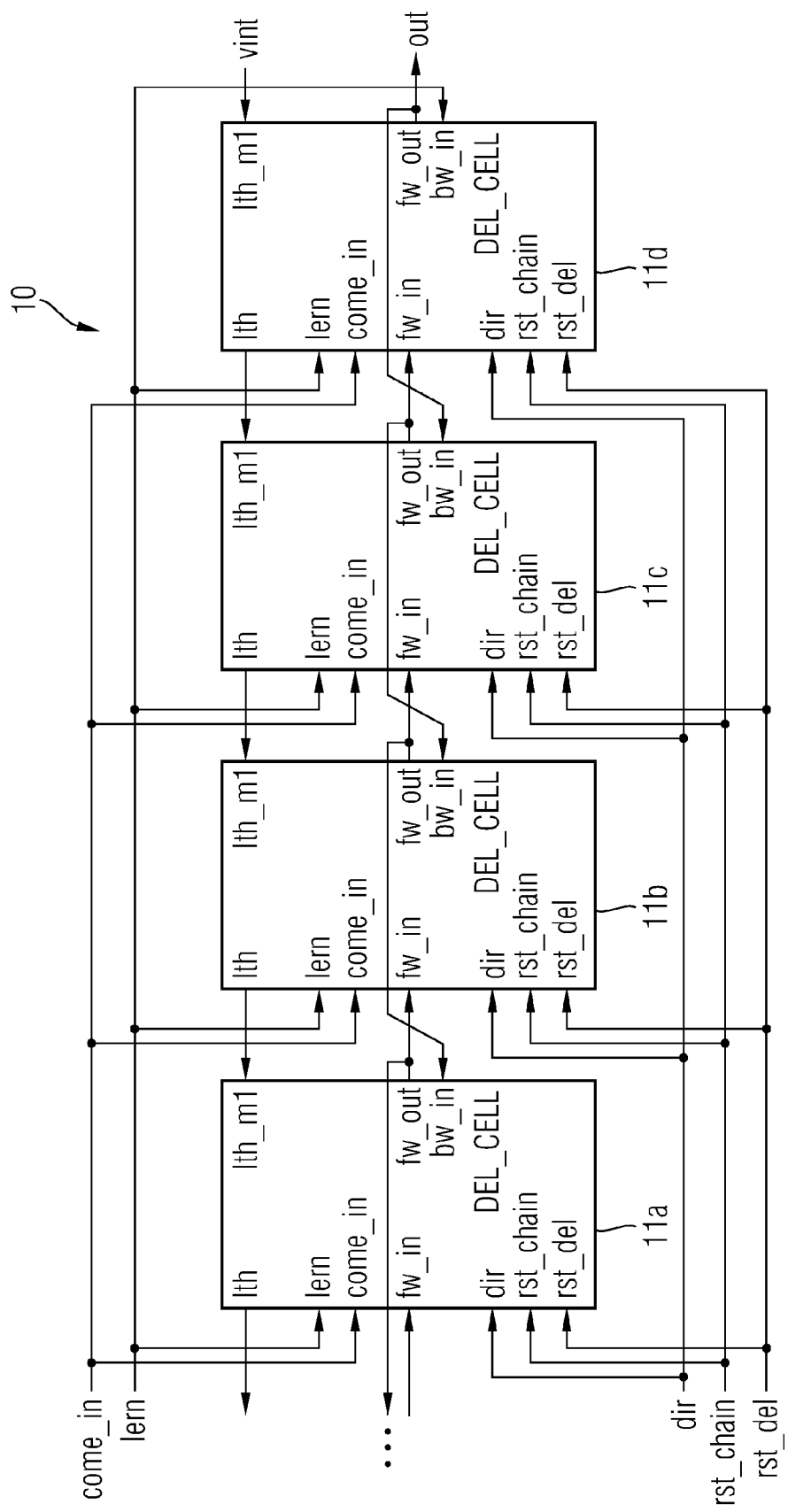
FIG. 2 illustrates a schematic view on a delay element according to one embodiment.

FIG. 2 illustrates a programmable delay element 10 according to one embodiment. The programmable delay element 10 illustrated in FIG. 2 includes a plurality of single delay cells 11a, 11b, 11c, 11d, . . . . The single delay cells 11a, 11b, 11c, 11d, . . . include at least a first input which is labeled come in. Furthermore, a second input is provided which is labeled as FW_IN. Every single delay cell 11a, 11b, 11c, 11d, . . . has at least one output which is labeled FW_OUT. The delay cells are coupled to form a chain. For this purpose, the output FW_OUT of a preceding delay cell is coupled to the input FW_IN of a successive delay cell. For illustrative purposes, FIG. 2 illustrates a chain built of four delay cells 11a, 11b, 11c, and 11d. It has to be noted that the number of delay cells may be greater than four or even smaller than four. As an example, one or more embodiments include two delay cells up to 100 delay cells.

The number of delay cells 11a, 11b, 11c, 11d, . . . and the delay implemented by a single delay cell 11a, 11b, 11c, 11d, . . . gives the total delay which is achievable by the proposed delay element 10 as well as the granularity, i.e. the smallest alterable process of the delay.

The delay of a single delay cell 11a, 11b, 11c, 11d, i.e. the smallest alterable process, may be different according to different embodiments. It may be in the range of 20 picoseconds up to 500 picoseconds. In one embodiment, it may be 200 picoseconds. In one embodiment, the delay of a single delay cell 11a, 11b, 11c, 11d may be adjusted by an electrical programming signal or by adjusting the supply voltage.

The signal which is intended to be delayed is delivered to the first input labeled come in of every delay cell delay of a single delay cell 11a, 11b, 11c, 11d constituting the chain of delay cells. However, only a single delay cell 11a, 11b, 11c, 11d out of the plurality of delay cells 11a, 11b, 11c, 11d constitutes a starting point of a signal path which includes the selected delay cell and any successive delay cells 11a, 11b, 11c, 11d in the chain.

The preceding delay cells out of the plurality of delay cells which are located upstream of the selected starting point are configured to block any signal delivered to their first inputs. In the same manner, any delay cells located downstream of the selected starting point are configured to block any incoming signal at their first inputs labeled come in. Only the selected starting point accepts a signal at its first input and directs the signal to the output labeled FW_OUT.

From the output of the first delay cell, the signal is directed to the second input FW_IN of a successive delay cell. This delay cell is intended to delay the signal and to direct it to the output FW_OUT. The output FW_OUT is coupled to the input FW_IN of the next delay cell in the chain. This process is repeated until the signal has reached the last delay cell in the chain. The output FW_OUT of the last delay cell 11d constitutes the output of the whole programmable delay element 10.

By selecting a different delay cell 11a, 11b, 11c, 11d out of the plurality of delay cells as a starting point, the length of the signal path is varied. By changing the length of the signal path, the total delay applied by the programmable delay element 10 to an input signal may be changed.

In order to mark the starting point for an incoming signal, a third input LTH_M1 and a second output LTH may be provided. According to this embodiment, every delay cell is configured to send a predefined logical value at its output LTH when it is selected to be part of a signal path. Every delay cell not being part of a signal path sends a different logical state at its second output LTH. For illustrating the principle, every delay cell being part of a signal path may have the logical value "high" at its output LTH. Every delay cell not being part of a signal path may have the logical value "low" at its output LTH. This means that the starting point of the signal path is that particular delay cell 11, which receives the logical state "high" at its input LTH_M1 and sends a logical state "low" at its output LTH.

In order to program the delay element 10, further input signals are provided to any delay cell 11a, 11b, 11c, 11d out of the plurality of delay cells. First of all, a reset signal can be received at the input labeled RST_CHAIN. When the signal supplied to the input RST_CHAIN takes a predefined logical state, the output LTH of most delay cells 11a, 11b, 11c, 11d is reset to the second logical state indicating that a minimum number of delay cells 11a, 11b, 11c, 11d is part of a signal path. In one embodiment, the minimum number of delay cells may be one. In case that a longer delay than the minimum delay is needed, the programmable delay element may be programmed in order to constitute a longer signal path.

Furthermore, a direction signal DIR may be applied switching the second input FW-IN to a deactivated state. When the direction signal is set to a predefined logical state, a signal on the input BW_IN is lead to the output FW_OUT. This state of the delay cells 11 is different from the state adopted in normal operation, wherein a signal provided at the input FW_IN is lead to the output FW_OUT and any signal provided at the input BW_IN is discarded. After the input BW_IN of the delay cells 11 has been activated by the direction signal DIR, a programming signal can be applied to the input LEARN of any delay cell out of the plurality of delay cells 11. Additionally, the programming signal is also fed to the input BW_IN of the last delay cell 11d in the chain.

The programming signal will propagate from the input BW_IN of the last delay cell 11d to the output FW_OUT of the last delay cell 11d. This output is coupled to the input BW_IN of the preceding delay cell 11c. It will propagate to the output FW_OUT of this delay cell 11c as well. In this manner, the programming signal will propagate from the last delay cell 11d to the first delay cell 11a in the chain.

As long as the programming signal has a predetermined logical state, the propagating programming signal will cause the output LTH to toggle from the second logical state to the first logical state, thereby indicating that the respective delay cell has just become part of a signal path. When the programming signal is switched off after a certain duration, a certain number of delay cells 11 has toggled there respective output LTH. This number of delay cells is determined by the traveling time of the programming signal up the chain. Therefore, the last delay cell which has been reached by the propagating signal during the time the programming signal was active at the input LEARN constitutes the starting point of the signal path.

In another embodiment, different signals may be provided to the inputs BW_IN of the last delay cell 11 and the input LEARN of the delay cells 11a, 11b, 11c, 11d, . . . . In this embodiment, the signal provided at the input LEARN is intended to indicate the time of the delay which has to be programmed into the delay element 10. The signal provided at the input BW-IN of the last delay cell 11d and travelling up the chain selects the number of delay cells 11a, 11b, 11c, 11d which are needed to provide that delay.

After a delay cell has been selected as starting point of a signal path, the user may wait for the propagating programming signal to reach the end of the chain of delay cells. In another embodiment, the propagating programming signal may be stopped by using a signal provided at the input RST_DEL. However, it has to be noted that this process is optional.

After the programming has been finished, the input FW_IN of the delay cells may be reactivated by toggling the signal at the input DIR. The delay element 10 is now ready for accepting input signals at its input COME_IN.

Figure 3:
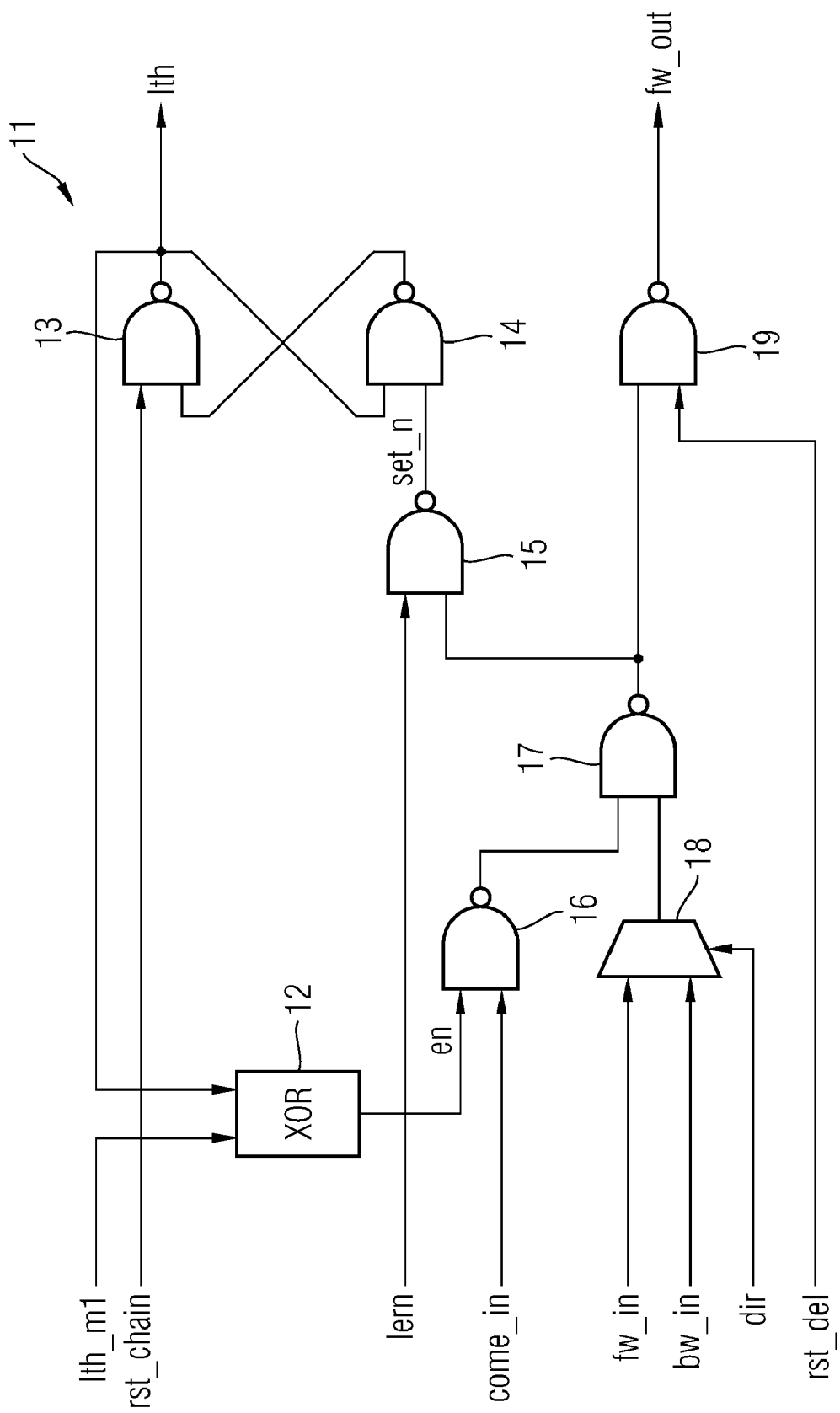
FIG. 3 illustrates a single delay cell which may be used in conjunction with one embodiment illustrated in FIG. 2.

FIG. 3 illustrates a schematic view of a single delay cell 11 which may be used in conjunction with a programmable delay element 10 as detailed in FIG. 2. The signal delay inside the delay cell 11 is mainly effectuated between the input FW_IN and the output FW_OUT. Inside this signal path, two NAND-elements 17 and 19 are provided. The propagation time of the signal in passing these NAND-elements defines the signal delay in a single delay cell 11. It has to be noted that a delay may also be obtained by other logical elements such as a NOT-Element, an OR-element, a XOR-element or the like or any combination of these elements known to those skilled in the art. Furthermore, it has to be noted that not every single delay cell 11 out of the plurality of delay cells being part of a single programmable delay element 10 must necessarily feature the same elements. The delay provided by a single delay cell may be different for any delay cell 11 or for a group of delay cells 11a, 11b, 11c, 11d.

In order to switch the direction of a signal traveling through the chain of delay cells 11, a second input BW_IN is provided as detailed with respect to FIG. 2. For switching the direction, a multiplexer 18 is suggested which may be controlled by a directional signal DIR. Depending a logical state of the signal DIR, the multiplexer 18 switches either the signal FW_IN to the input of the NAND-element 17 or the input signal BW_IN.

In order to constitute a starting point of a signal path including a plurality of series-connected delay cells, a NAND-element 16 is provided which is configured to block the input signal provided at the input COME_IN for any delay cell 11 except the first one. Blocking of the input COME_IN is done by using an enabling signal EN which is provided by a XOR-element 12. The XOR-element generates the enabling signal EN by comparing the signal provided at the input LTH_M1, i.e. a signal representing the status of a successive delay cell in the chain and a signal generated by the NAND-element 13 which generates the output signal LTH, i.e. the signal representing the status of the present delay cell 11. If both input signals of the XOR-element 12 have the same logical state, the respective delay cell 11 is arranged in the middle of a signal path or outside of the signal path. Therefore, the enabling signal EN takes the logical state false, i.e. the input COME_IN will be blocked.

In case that both input signals of the XOR-element 12 have adopted different logical states, the enable signal is true, indicating that the respective delay cell 11 defines the border between activated and deactivated delay cells, i.e. the starting point of the signal path.

The current status of a delay cell 11 being part of the signal path or not is encoded in the output signal LTH which is generated by using NAND-elements 13 and 14 forming a flip-flop. The logical state given at the output LTH may be reset by a signal RST_CHAIN delivered to one input of the flip-flop 13, 14. After having received a reset signal, the delay cell is marked not to be part of a signal path.

When a programming signal is provided at the input LEARN, the flip-flop 13, 14 is allowed to toggle, if the programming signal is not blocked at the NAND-element 15. This is the case when the programming signal propagating along the chain of delay cells 11 has reached the input BW_IN of a respective delay cell 11 and the logical state is still present at the input learn. This means, that the propagating signal on its way up the chain must be as fast as its signal width.

Figure 4:
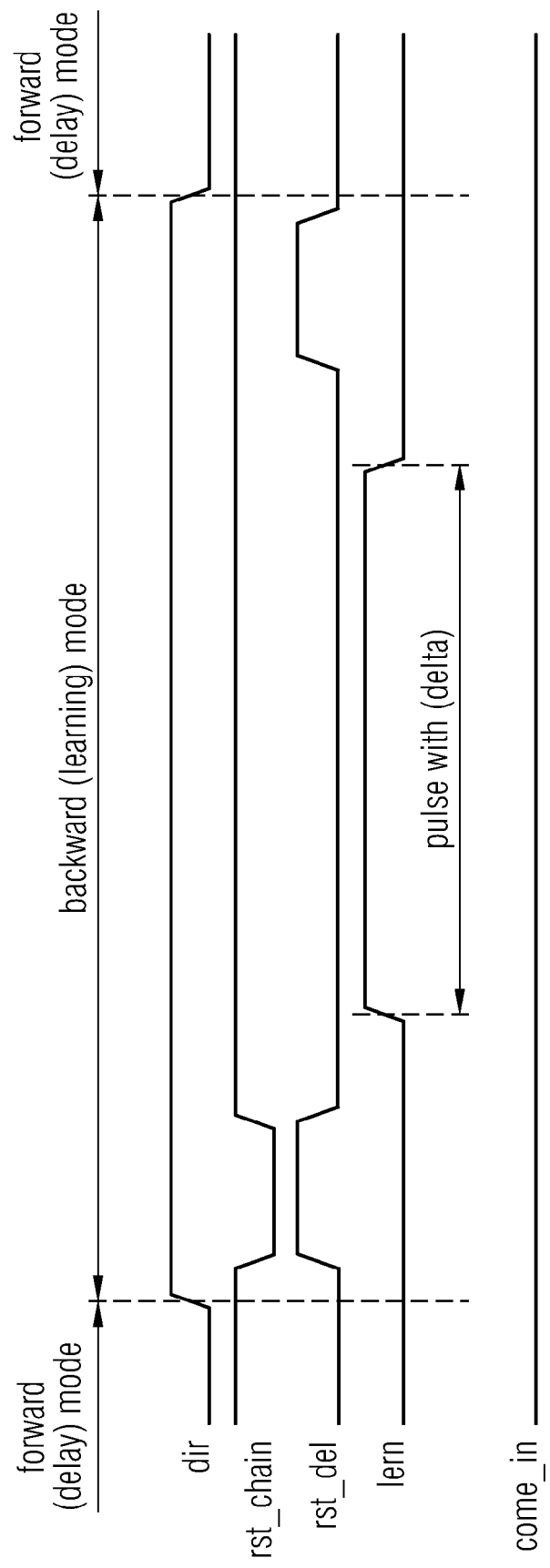
FIG. 4 illustrates a timing diagram of some signals which may be involved when operating a delay element according to FIG. 2.

FIG. 4 illustrates a timing diagram of signals involved when programming a delay element 10 explained with respect to FIGS. 2 and 3. During the programming, no signal to delay is supplied at the first input named COME_IN.

At the beginning of the programming mode, the input direction is switched by sending an appropriate logical state by using the input DIR to the multiplexer 18. For illustrative purposes only, the multiplexer 18 will forward the signal FW_IN to the NAND-element 17 when a logical 0 is applied to the input DIR. The multiplexer 18 will connect the signal BW_IN to the input of the NAND-element 17 when a logical 1 is supplied at the input DIR. This means that the programmable delay element is in normal operation or forward mode when the input DIR receives a logic 0 and the delay element is in programming or backward mode when the input DIR receives a logic 1.

In order to allow the programming of a new value for the delay, the current starting point of the signal path has to be deleted. This is done by using an erasing signal sent to the input RST_CHAIN of any delay cell in the chain. In the example detailed in FIG. 4, the flip-flop constituted by NAND-elements 13 and 14 is in normal operation when a logic 1 is delivered to the free input of the NAND-element 13. When a logic 0 is sent to that input, the flip-flop 13, 14 is reset to a default value.

Optionally, the signal path constituted by the input BW_IN, the NAND-element 17 and 19 and the output FW_OUT may be reset by applying a reset signal to the input RST_DEL. This will set all output signal FW_OUT of all delay cells to a predetermined state and therefore allows for all signals still travelling on the signal path to be erased from any delay cell 11 of the delay element 10.

After the chain of delay cells 11 has been prepared in the described manner, a programming signal is applied at the input LEARN of all delay cells in the chain. Additionally, the programming signal LEARN is inverted and applied to the input BW_IN of the last delay cell 11*d* in the chain. The programming signal LEARN has a pulse width DELTA which resembles the delay to be programmed into the programmable delay element 10. Again, for illustrative purposes, a positive logic is chosen, i.e. the programming signal assumes a logical 0 when idling and assumes a logical 1 during the programming procedure.

The programming signal LEARN is directed to all NAND-elements 15 of every delay cells 11. Additionally, the programming signal LEARN propagates from the last delay cell 11*d* to the first delay cell 11*a*. Every time the programming signal has passed a NAND-element 17 of a delay cell 11, the signal passes the respective NAND-element 15 and sets the flip-flop 13, 14 as long as the pulse width of the programming signal has not yet elapsed. The programming signal propagating along the chain of delay cells 11 after that point in time may be reset by using a signal RST_DEL. After the signal RST_DEL has been set to its original value, the direction signal DIR can be set back to normal operation and the programming mode ends.

Figure 5:
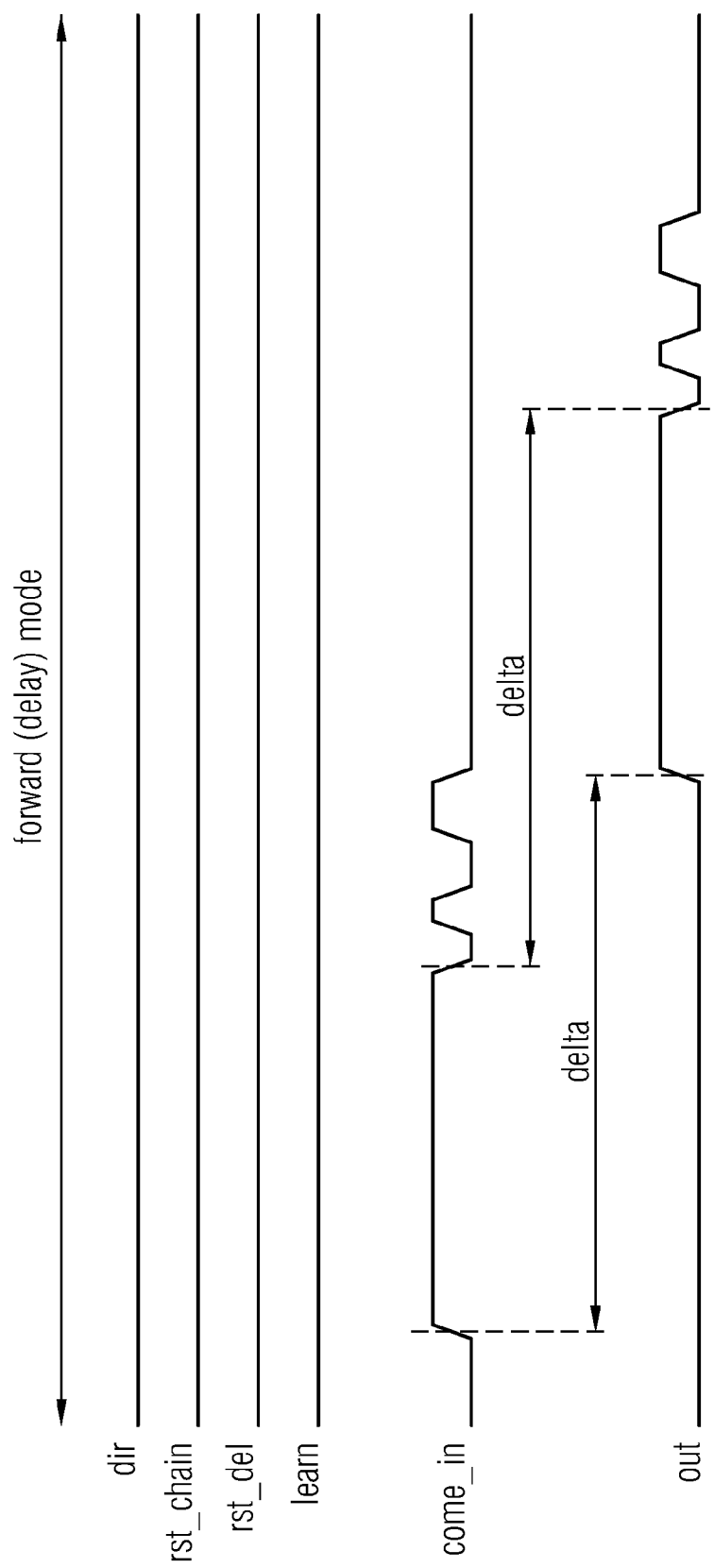
FIG. 5 illustrates another timing diagram with signals which may be measured when operating a delay element according to FIG. 2.

FIG. 5 illustrates a timing diagram during the forward or regular operation mode. The direction signal DIR as well as the reset signals RST_CHAIN, RST_DEL and the programming signal LEARN is held at a predefined logical state in order not to disturb the propagation of the wanted signal. For illustrative purposes only, this state is chosen to be logic 0 in FIG. 5.

FIG. 5 illustrates an illustrative example of an input signal which may be supplied to the first inputs COME_IN of the delay cells 11 of the programmable delay element 10. As detailed above, the input signal will be discarded by all delay cells 11 except of one selected delay cell 11. This single delay cell 11 will constitute a starting point of a signal path and at the output of the delay element 10, an output signal OUT will be provided which is roughly identical to the input signal but delayed by a time span DELTA which resembles approximately the pulse width DELTA of the programming signal LEARN.

Figure 6:
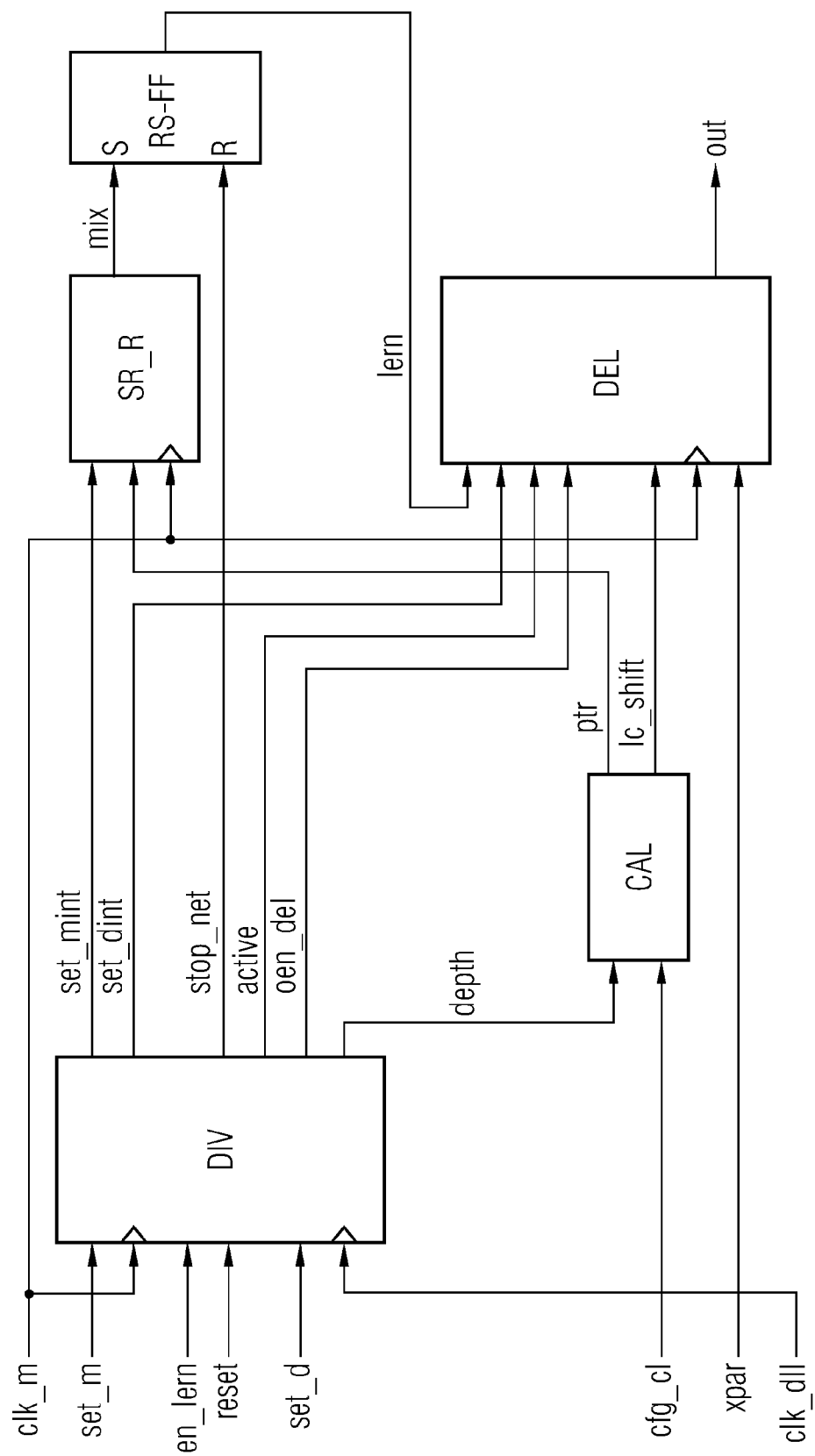
FIG. 6 illustrates a block diagram of a circuit which may be used to realign an output signal to an external clock signal.

FIG. 6 illustrates a block diagram of a circuit which may be used to align an output signal of an integrated circuit to an external clock signal as has been described with respect to FIG. 1. The circuit includes at least a delay unit DEL, a reference shift register SR_R, a calibration unit CAL, a control unit RS-FF, and a counting unit DIV. The functional cooperation of these entities is explained with respect to FIG. 6 to 9.

The signal intended to be outputted XPAR is fed to the delay unit DEL. The delay unit DEL is configured to receive the signal XPAR and to provide either to an output pin of the circuit or to a subsequent circuit not illustrated in FIG. 6 such as a line driver. At the output of the delay unit DEL, the signal has a delay of at least a fraction of a clock cycle of a clock signal. As an alternative or additionally, the signal XPAR may be delayed by several clock cycles.

The remaining units DIV, CAL, SR and RS-FF are intended to determine the amount of delay needed in order to achieve an output signal OUT which is synchronized to a desired clock signal such as an external clock signal VCLK illustrated in FIG. 1.

To achieve this, the integrated circuit may also include a unit to generate a clock signal CLOCK_DLL which has a phase shift or a delay compared to the master clock signal CLK_m. According to one embodiment, the clock signal CLK_DLL may be generated by using a delay locked loop. In another embodiment, the clock signal CLK_DLL may be generated by using a phase locked loop. In still another embodiment, the clock signal CLK_DLL may be generated by using a delay element which may provide either a fixed delay or a variable delay.

The clock-signal-generating mechanisms which are intended to provide the clock signal CLK_DLL may be configured to provide also a first synchronization signal SET_D. In one embodiment, the synchronization signal SET_D may be obtained by using a counter which generates a synchronization signal SET_D after a predetermined number of clock cycles has been counted. In embodiments, the number of clock cycles may be 4, 8, 16, 32, 64 or 128. However, the first synchronization signal SET_D may be generated differently according to the needs of a certain implementation.

Furthermore, the clock-generating mechanisms may provide a second synchronization signal SET_M. According to one or more embodiments, the time elapsed between a rising or a falling edge of the first synchronization signal SET_D and the respective rising or falling edge of the second synchronization signal SET_M may be given by a predetermined number of clock cycles such as 4, 8, 16, 32 or 64 clock cycles. In still another embodiment, the signals SET_M and SET_D may give the feedback delay of a delay locked loop used to provide the clock signal CLK_DLL from the clock signal CLK_m. However, the second synchronization signal SET_M may be generated differently according to the needs of a certain implementation.

In order to compensate for internal delays and/or to compensate signal degeneration, an integrated circuit according to one embodiment may provide a unit for reshaping and/or realigning the first and second synchronization signal SET_M and SET_D. Such reshaped and/or realigned signals may be named SET_MINT and SET_DINT. However, this process is completely optional and may be omitted for one synchronization signal or for both synchronization signals according to other embodiments.

A delay applied by the delay unit DEL to a signal XPAR may be split up into a synchronous delay including a given number of full and/or half clock cycles and an asynchronous delay including at least a fraction of a clock cycle. A delay to be applied may be provided to the circuit by a delay set point CFG_CL. According to one embodiment, the signal CFG_CL may be a digitally encoded signal.

In order to determine the synchronous delay by which the signal XPAR should be delayed to form the signal OUT, the first synchronization signal SET_D or the realigned and/or reshaped derivative SET_DINT may be used to start a first counter which counts a predefined number of clock cycles of the delayed clock signal CLK_DLL. The counter may be part of the unit DIV illustrated in FIG. 6. The predefined number of clock cycles may be different in different embodiments. According to one embodiment, the number might be 4. In another embodiment, the number may be 8. In still another embodiment, the number may be 16 or 32.

After the predefined number of clock cycles has been counted, the counter will generate a stop signal STOP_NET. At the same time, the second synchronization signal SET_M or its realigned and/or reshaped derivative SET_MINT is used to start a second counter which is configured to count clock cycles of the master clock signal CLK_m. This counter will be stopped when receiving the stop signal STOP_NET. In order to increase the resolution of the second counter, a realigned and/or reshaped derivative of the signal STOP_NET may be used to control the counter.

The realization of a counter which is suitable as a first counter and/or as a second counter is known to those skilled in the art. In one embodiment, a counter may store 3 bits of information in order to allow 8 clock cycles to be counted. In another embodiment, a counter may use 4, 5 or 6 bits in order to store a higher amount of information. In one embodiment, the counter may be a gray counter which is characterized in that only one bit is changed every time a leading or a trailing edge of the clock signal to be counted occurs.

After the second counter has been stopped, the current value is read and this value is used to determine a synchronous delay to be applied to the signal XPAR.

It has to be noted that in one embodiment, the circuit may be in continuous operation. This means that the first counter and/or the second counter are not halted but count their respective input signals continuously. At the respective "stop"-signal mentioned above, the actual value of the counter is sampled and the counter continues to count raising and/or falling edges of its input signal.

In order to determine the asynchronous delay, i.e. the difference between the delay set point CFG_CL and the synchronous delay, this difference is calculated in the unit CAL. The result of this calculation is supplied as signal PTR to the reference shift register SR. The shift register SR controls a flip-flop RS-FF in order to initiate the programming of the delay element DEL.

Figure 7:
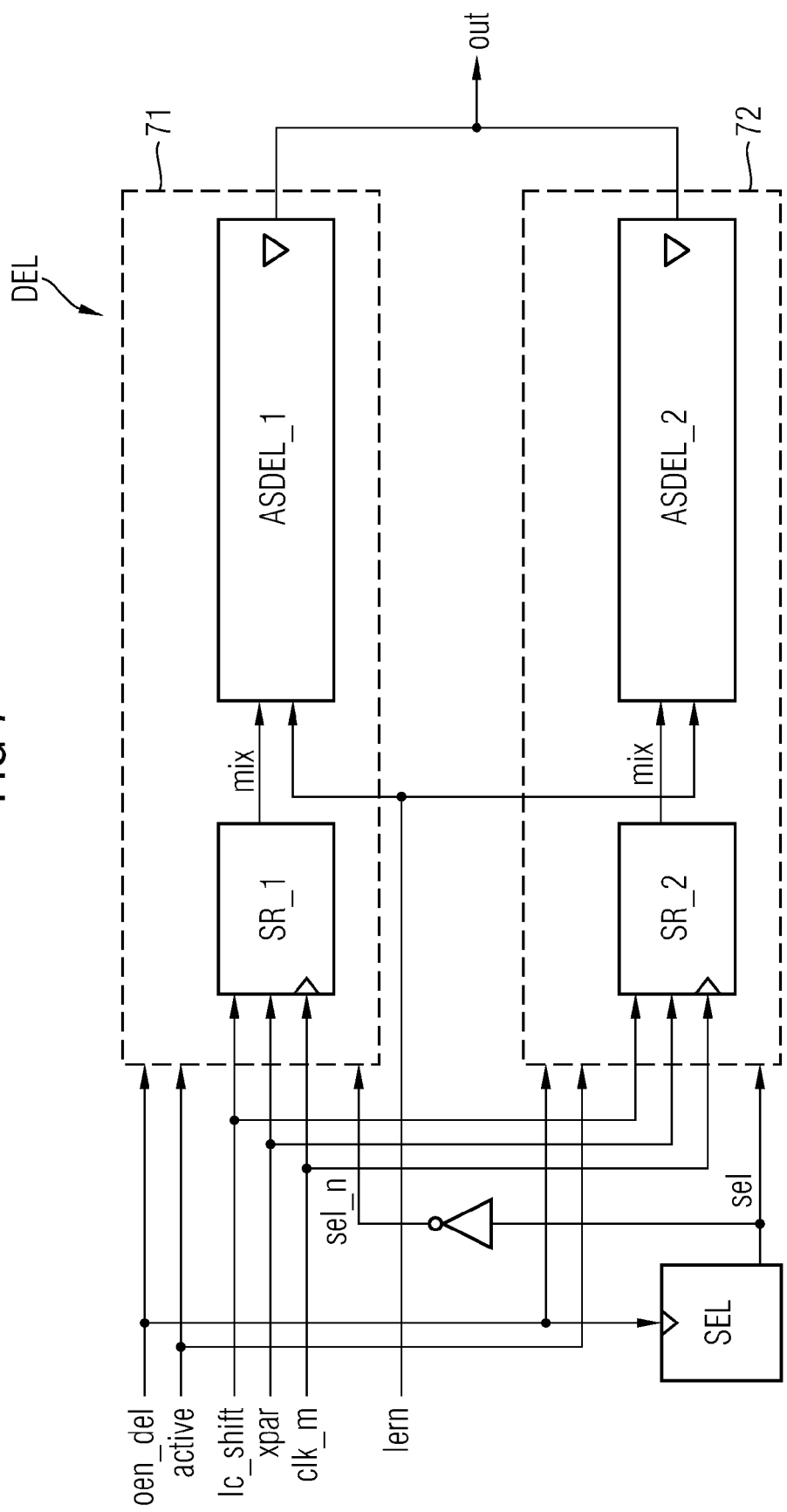
FIG. 7 illustrates in detail one part of the circuit illustrated in FIG. 6 according to one embodiment.

In one embodiment, the delay unit DEL has an internal assembly as detailed in FIG. 7. This means that the delay of the input signal XPAR is done by four delay elements SR_1, SR_2, ASDEL_1, and ASDEL_2. The first delay elements SR_1 and SR_2 may include a shift register which is configured to apply a synchronous delay to the input signal, i.e. to shift the input signal XPAR by a predefined number of clock cycles. In one embodiment, the number of clock cycles may be defined by a number of full clock cycles. In another embodiment, the number of clock cycles may be defined as a number of half clock cycles.

Subsequently, the output signals of the shift registers SR_1 and SR_2 are coupled to a respective asynchronous delay element ASDEL_1 and ASDEL_2. In one embodiment, the asynchronous delay elements ASDEL_1 and ASDEL_2 will provide a delay in the amount of a fraction of a full clock cycle. In another embodiment, the asynchronous delay elements ASDEL_1 and ASDEL_2 will provide a delay which is a fraction of a half clock cycle. In still another embodiment, the asynchronous delay elements ASDEL_1 and ASDEL_2 will provide a delay in the amount of at least one full clock cycle and a fraction of a full clock cycle. At the output of the asynchronous delay elements ASDEL_1 and ASDEL_2, an output signal OUT is provided which is synchronized to an external clock domain when the amount of full or half clock cycles in the shift registers SR_1 and SR_2 and the amount of the asynchronous delay in the asynchronous delay elements ASDEL_1 and ASDEL_2 is chosen accordingly.

In order to allow for an uninterrupted operation of the delay element DEL, the shift registers SR_1 and SR_2 and the asynchronous delay elements ASDEL_1 and ASDEL_2 may be arranged in two parallel data paths, the first data path 71 including the shift register SR_1 and the asynchronous delay element ASDEL_1 and the second data path 72 including the shift register SR_2 and the asynchronous delay element ASDEL_2 as illustrated in FIG. 7. This allows the programming of the first signal path 71 while operating the second signal path 72. After the programming has been completed, the first signal path 71 may be operated so that the second signal path 72 may be programmed. In order to select the respective signal path, a selection unit SEL is provided which will receive a control signal generated by the units CAL and/or SR and/or RS-FF detailed in FIG. 6.

All shift registers SR_R, SR_1 and SR_2 may be of the same type. The internal circuitry of the shift registers is known to those skilled in the art. The invention does not rely on a certain type of shift registers used.

An asynchronous delay element is also known to those skilled in the art. The invention does not rely on a certain type of an asynchronous delay element used. In one embodiment, the asynchronous delay element illustrated with respect to FIGS. 2 to 5 may be used in conjunction with the invention.

With respect to FIG. 8, some signals are explained which might be useful when operating the circuit according to FIG. 6 and FIG. 7. The second line of FIG. 8 illustrates a delayed clock signal CLK_DLL which has been generated from a master clock signal CLK_m as explained with respect to FIG. 6. The clock-generating mechanisms which provides the delayed clock signal CLK_DLL also generates the control signals SET_D and SET_M. The delay between the control signals SET_D and SET_M amounts roughly to the delay between the clock signal CLK_DLL and CLK_m.

In order to compensate a signal degradation which may occur to a signal propagation on an integrated circuit, the synchronization signals are realigned and reshaped to form the signals SET_DINT and SET_MINT.

At predefined or user selected time intervals, the circuit determines new values for a synchronous delay and an asynchronous delay to be stored inside the delay unit DEL. The generation of new delay values is initiated by using a learning signal EN_LEARN which is configured to initiate the recalibration of at least one signal path in the delay unit DEL. The learning routine may be started at predefined time intervals. In one embodiment, a time interval may be 256 clock cycles. In another embodiment, the time interval may be 512 clock cycles. In still another embodiment, the time interval may be 1024 clock cycles. In still another embodiment, the time interval may be constituted by another number of clock cycles not mentioned in detail.

When the calibration routine is active, the signal SET_DINT starts a counter in order to generate a stop signal STOP_NET after a predetermined time span. In the embodiment illustrates in FIG. 8, this time span amounts to 8 clock cycles of the clock signal CLK_DLL. However, this number is chosen for illustrative purposes only.

The second synchronization signal SET_MINT also starts a counter, counting clock cycles of the signal CLOCK_m. The counter will be stopped after the stop signal STOP_NET has been received. As can be seen from FIG. 8, the counter has completed 5 full clock cycles. It has to be noted that this number is chosen only for illustrative purposes. When practicing the invention, other output values CNT_m of the counter might occur. The output value of the counter at the moment when the stop signal STOP_NET stops the counter is represented by the signal DEPTH. This signal is used to set the shift register SR_1 or SR_2 inside the delay unit DEL as well as the reference shift register SR_R to the desired value, in this example 5.

The programming of the asynchronous delay path is explained with respect to FIG. 9. The signals EN_LEARN, CLK_DLL, SET_D, SET_DINT, STOP_NET, CLK_m, SET_M, SET_MINT and CNT_m are cooperating in the same manner as explained with reference to FIG. 8. After the value for the synchronous delay, i.e. the number of complete clock cycles DEPTH, has been passed to the reference shift register SR_R, a signal MIX is generated by the reference shift register SR_R. The signal MIX will start at the beginning of the last completed clock cycle before the signal STOP_NET stops the second counter. It will have a width of one clock cycle.

The unit RS-FF is used to build the difference between the signal MIX and the signal STOP_NET. This difference is represented by the signal LEARN. The signal LEARN includes a pulse which has the same duration as the asynchronous delay needed in order to achieve a synchronization of the output signal OUT to an external clock signal after the shift register SR_1 or SR_2. When the asynchronous delay units ASDEL_1 or ASDEL_2 inside the delay unit DEL are of the type detailed in FIGS. 2 and 3, the signals RESET_CHAIN, LEARN and RESET_DEL may be used to program the asynchronous delay ASDEL_1 or ASDEL_2 respectively.

If at least two signal paths are present as detailed in FIG. 7, the signals active, OE_DEL and SEL are used to control the signal path to be programmed. After the programming has taken place, the select signal SEL changes its state and puts the freshly programmed signal path into operation while allowing the other signal path to be programmed in the above recited manner.

According to one embodiment, the circuit detailed in FIGS. 6 and 7 is in one embodiment useful to compensate the column access strobe latency on a DRAM chip. However, the use of the circuit according to embodiments is not limited to this special example. In fact it can be used with every circuitry with internal delays which destroy the correlation of an output signal to an external clock signal, so that realignment of the output signal is needed. The circuit illustrated with respect to FIGS. 6 to 9 is in one embodiment useful to save electric energy consumed by an integrated circuit, as the clock signal CLK_DLL may be switched of after having calibrated the delay unit DEL.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a delay unit having an input and an output, the delay unit being configured to delay a signal applied to the input of the delay unit for a predetermined number of clock cycles of a clock signal and additionally for a predetermined fraction of the clock cycle of the clock signal and to apply the delayed signal to the output of the delay unit, the delay unit comprising:
      at least one shift register having an input and an output, the shift register being configured to delay the signal applied to the input of the delay unit for the predetermined number of clock cycles of the clock signal; and
      at least one asynchronous delay element, the asynchronous delay element being configured to delay the signal applied to the input of the delay unit for the predetermined fraction of the clock cycle of the clock signal.

2. The integrated circuit of claim 1, comprising further clock signal generating mechanism configured to provide an internal clock signal with a predetermined delay to the clock signal and counting mechanism configured to determine the number of full and/or half clock cycles elapsed during the delay and to provide the number of full and/or half clock cycles to the shift register.

3. The integrated circuit of claim 2, wherein the clock signal generating mechanism is configured to provide at least one signal representing the delay between the clock signal and the internal clock signal generated by the clock signal generating mechanism.

4. The integrated circuit of claim 2, comprising further a determining mechanism being configured to determining the time difference between the delay between the clock signal and the internal clock signal generated by the clock signal generating mechanisms and the last full and/or half clock cycle determined by the counting mechanisms, wherein the means for determining the time difference are configured to provide the time difference to the asynchronous delay element.

5. An integrated circuit comprising:
a delay unit having an input and an output, the delay unit being configured to delay a signal applied to the input of the delay unit for a predetermined number of clock cycles of a clock signal and additionally for a predetermined fraction of the clock cycle of the clock signal and to apply the delayed signal to the output of the delay unit, the delay unit comprising:
two shift registers; and
two asynchronous delay elements, each having an input and an output and wherein the output of the first shift register is coupled to the input of the first asynchronous delay element and the output of the second shift register is coupled to the input of the second asynchronous delay element, and wherein the input of the first and second shift registers are configured to alternately receive the signal to be delayed.

6. The integrated circuit of claim 5, comprising wherein the first asynchronous delay element and the first shift register are configured to delay an output signal during the calibration of the second asynchronous delay element and the second shift register and the second asynchronous delay element and the second shift register are configured to delay an output signal during the calibration of the first asynchronous delay element and the first shift register.

7. An integrated circuit comprising:
a delay unit having an input and an output, the delay unit being configured to delay a signal applied to the input of the delay unit for a predetermined number of clock cycles of a clock signal and additionally for a predetermined fraction of the clock cycle of the clock signal and to apply the delayed signal to the output of the delay unit, comprising further at least one dynamic random access memory cell.

8. An integrated circuit comprising:
at least two inputs; and
at least one output, the integrated circuit being configured to receive an input signal at its first input and a clock signal at its second input,
wherein the integrated circuit is configured to generate an output signal from the input signal;
wherein at least one shift register is provided, having an input and an output;
wherein the shift register is configured to delay the output signal for a predetermined number of clock cycles of the clock signal and at least one asynchronous delay element having an input and an output is provided;
wherein the output of the shift register is coupled to the input of the asynchronous delay element; and
wherein the asynchronous delay element is configured to delay the output signal for a predetermined fraction of a clock cycle of the clock signal.

9. The integrated circuit of claim 8, comprising further clock signal generating mechanisms configured to provide a clock signal with a predetermined delay to the clock signal at the second input of the integrated circuit and counting mechanisms configured to determine the number of full and/or half clock cycles elapsed during the delay, wherein the counting mechanisms are configured to provide the number of full and/or half clock cycles to the shift register.

10. The integrated circuit of claim 9, wherein the clock signal generating mechanisms are configured to provide at least one signal representing the delay between the clock signal at the second input of the integrated circuit and the clock signal generated by the clock signal generating mechanism.

11. The integrated circuit of claim 9, comprising further mechanisms for determining the time difference between the delay between the clock signal at the second input of the integrated circuit and the clock signal generated by the clock signal generating mechanisms and the last full and/or half clock cycle determined by the counting mechanisms, wherein the means for determining the time difference are configured to provide the time difference to the asynchronous delay element.

12. The integrated circuit of claim 8, comprising:
two shift registers; and
two asynchronous delay elements, each having an input and an output and wherein the output of the first shift register is coupled to the input of the first asynchronous delay element and the output of the second shift register is coupled to the input of the second asynchronous delay element, and wherein the input of the first and second shift registers are configured to alternately receive the signal to be delayed.

13. The integrated circuit of claim 12, comprising wherein the first asynchronous delay element and the first shift register are configured to delay an output signal during the calibration of the second asynchronous delay element and the second shift register and the second asynchronous delay element and the second shift register are configured to delay an output signal during the calibration of the first asynchronous delay element and the first shift register.

14. The integrated circuit of claim 8, comprising further at least one dynamic random access memory cell.

15. A method for providing an output signal generated from an input signal, the input signal being synchronized to a first clock signal and the output signal being delayed such that the output signal is also synchronized to the first clock signal, comprising:
determining a synchronous delay;
determining an asynchronous delay;
delaying the output signal by the synchronous delay; and
delaying the output signal by the asynchronous delay.

16. The method of claim 15, comprising generating at least one signal which represents the sum of the synchronous delay and the asynchronous delay.

17. The method of claim 15, comprising determining the synchronous delay by counting the number of full and/or half clock cycles during the delay time span.

18. The method of claim 15, comprising determining the asynchronous delay by subtracting the synchronous delay from the total delay.

19. The method of claim 15, comprising wherein the determination of any of the synchronous delay and/or the asynchronous delay is done simultaneously while delaying the output signal.

20. The method of claim 15, comprising wherein the determination of any of the synchronous delay and/or the asynchronous delay is done isochronous.

21. The method of claim 20, comprising wherein the determination of any of the synchronous delay and/or the asynchronous delay is done at least every 8 clock cycles and at most every 1024 clock cycles.

\* \* \* \* \*